US010249738B2

(12) United States Patent
Bergendahl et al.

(10) Patent No.: US 10,249,738 B2
(45) Date of Patent: Apr. 2, 2019

(54) NANOSHEET CHANNEL-TO-SOURCE AND DRAIN ISOLATION

(71) Applicant: International Business Machines Corporation, Armonk, NY (US)

(72) Inventors: Marc A. Bergendahl, Troy, NY (US); Kangguo Cheng, Schenectady, NY (US); Fee Li Lie, Albany, NY (US); Eric R. Miller, Schenectady, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/355,521

(22) Filed: Nov. 18, 2016

(65) Prior Publication Data

US 2018/0083118 A1   Mar. 22, 2018

Related U.S. Application Data

(62) Division of application No. 15/270,109, filed on Sep. 20, 2016, now Pat. No. 9,620,590.

(51) Int. Cl.
*H01L 21/00* (2006.01)
*H01L 29/66* (2006.01)
(Continued)

(52) U.S. Cl.
CPC .... *H01L 29/6681* (2013.01); *H01L 21/31111* (2013.01); *H01L 21/76224* (2013.01);
(Continued)

(58) Field of Classification Search
CPC .......... H01L 29/6681; H01L 21/31111; H01L 29/0847
See application file for complete search history.

(56) References Cited

U.S. PATENT DOCUMENTS

| 8,476,706 B1* | 7/2013 | Chidambarrao .... H01L 21/8238 257/338 |
| 8,765,510 B2* | 7/2014 | Lochtefeld ........ H01L 21/02381 257/101 |

(Continued)

OTHER PUBLICATIONS

List of IBM Patents or Patent Applications Treated as Related; (Appendix P), Filed Nov. 18, 2016; 2 pages.

(Continued)

*Primary Examiner* — Laura Menz
(74) *Attorney, Agent, or Firm* — Cantor Colburn LLP; Vazken Alexanian

(57) ABSTRACT

A method and structures are used to fabricate a nanosheet semiconductor device. Nanosheet fins including nanosheet stacks including alternating silicon (Si) layers and silicon germanium (SiGe) layers are formed on a substrate and etched to define a first end and a second end along a first axis between which each nanosheet fin extends parallel to every other nanosheet fin. The SiGe layers are undercut in the nanosheet stacks at the first end and the second end to form divots, and a dielectric is deposited in the divots. The SiGe layers between the Si layers are removed before forming source and drain regions of the nanosheet semiconductor device such that there are gaps between the Si layers of each nanosheet stack, and the dielectric anchors the Si layers. The gaps are filled with an oxide that is removed after removing the dummy gate and prior to forming the replacement gate.

9 Claims, 19 Drawing Sheets

(51) Int. Cl.
*H01L 29/06* (2006.01)
*H01L 21/311* (2006.01)
*H01L 29/08* (2006.01)
*H01L 29/78* (2006.01)
*H01L 29/417* (2006.01)
*H01L 29/423* (2006.01)
*H01L 21/762* (2006.01)
*H01L 29/775* (2006.01)
*H01L 29/786* (2006.01)

(52) U.S. Cl.
CPC ...... *H01L 29/0653* (2013.01); *H01L 29/0673* (2013.01); *H01L 29/0847* (2013.01); *H01L 29/41725* (2013.01); *H01L 29/42392* (2013.01); *H01L 29/6653* (2013.01); *H01L 29/66439* (2013.01); *H01L 29/66545* (2013.01); *H01L 29/775* (2013.01); *H01L 29/7853* (2013.01); *H01L 29/78696* (2013.01); *H05K 999/99* (2013.01)

(56) References Cited

U.S. PATENT DOCUMENTS

| | | | |
|---|---|---|---|
| 9,129,829 B2 | 9/2015 | Kuhn et al. | |
| 9,349,809 B1* | 5/2016 | Cheng | H01L 29/267 |
| 9,362,355 B1* | 6/2016 | Cheng | H01L 29/66742 |
| 9,484,347 B1* | 11/2016 | Cheng | H01L 27/0922 |
| 9,490,335 B1* | 11/2016 | Doris | H01L 27/0922 |
| 9,620,590 B1* | 4/2017 | Bergendahl | H01L 29/0673 |
| 2006/0216897 A1* | 9/2006 | Lee | B82Y 10/00 438/282 |
| 2014/0001441 A1 | 1/2014 | Kim et al. | |
| 2015/0295084 A1* | 10/2015 | Obradovic | H01L 29/7845 257/347 |
| 2015/0325648 A1 | 11/2015 | Cea et al. | |
| 2015/0364542 A1* | 12/2015 | Rodder | B82Y 10/00 257/29 |
| 2016/0020305 A1* | 1/2016 | Obradovic | H01L 29/7391 257/39 |
| 2016/0049489 A1* | 2/2016 | Wan | H01L 29/42392 257/347 |
| 2016/0111337 A1* | 4/2016 | Hatcher | H01L 21/823807 438/154 |
| 2016/0126310 A1* | 5/2016 | Rodder | H01L 29/41758 257/9 |
| 2016/0163796 A1* | 6/2016 | Obradovic | B82Y 10/00 257/9 |
| 2017/0323949 A1* | 11/2017 | Loubet | H01L 29/42392 |

OTHER PUBLICATIONS

Marc A. Bergendahl et al., "Nanosheet Channel-To-Source and Drain Isolation", U.S. Appl. No. 15/270,109, filed Sep. 20, 2016.
Filed Nov. 18, 2016, U.S. Appl. No. 15/355,521, US Pat. Pub. No. 2018-0083118.
Filed Aug. 21, 2017, U.S. Appl. No. 16/106,359.

* cited by examiner

NANOSHEET CHANNEL-TO-SOURCE AND DRAIN ISOLATION

DOMESTIC BENEFIT/NATIONAL STAGE INFORMATION

This application is a division of U.S. application Ser. No. 15/270,109 filed Sep. 20, 2016, the disclosure of which is incorporated herein by reference in its entirety.

BACKGROUND

The present invention relates to semiconductor device fabrication, and more specifically, to nanosheet channel-to-source and drain isolation.

As semiconductor integrated circuits (ICs) or chips become smaller, stacked nanosheets, which are two-dimensional nanostructures with a thickness range on the order of 1 to 100 nanometers, are increasingly used. Nanosheets and nanowires are seen as a feasible device option for 7 nanometer and beyond scaling of semiconductor devices. The general process flow for nanosheet formation involves removing sacrificial layers of silicon germanium (SiGe) between the silicon (Si) sheets.

SUMMARY

According to one or more embodiments of the present invention, a method of fabricating a nanosheet semiconductor device includes forming nanosheet fins including nanosheet stacks including alternating silicon (Si) layers and silicon germanium (SiGe) layers on a substrate. The method further includes etching each nanosheet fin to define a first end and a second end along a first axis between which each nanosheet fin extends parallel to every other nanosheet fin. The method further includes undercutting the SiGe layers in the nanosheet stacks at the first end and the second end to form divots at the first end and the second end. Depositing a dielectric at the first end and the second end includes depositing the dielectric in the divots at the first end and the second end, and removing the SiGe layers between the Si layers leaves gaps between the Si layers of each nanosheet stack such that the dielectric anchors the Si layers at the first end and the second end. Removing the SiGe layers precedes forming source and drain regions of the nanosheet semiconductor device. The gaps are filled with an oxide to form second nanosheet stacks including alternating layers of the Si and the oxide prior to forming a dummy gate above the nanosheet stacks. The method further includes removing the oxide after removal of the dummy gate and prior to replacement with a replacement gate.

According to one or more embodiments, a structure used to fabricate a nanosheet semiconductor device includes a substrate and two or more sets of silicon layers formed above the substrate. Each of the two or more sets of silicon layers is parallel to others of the two or more sets of silicon layers in a first direction, and each of the two or more sets of silicon layers includes gaps between the silicon layers of the respective set of silicon layers. The structure also includes a dielectric material to anchor each of the two or more sets of silicon layers at a first end and a second end along a second direction, which is perpendicular to the first direction.

According to one or more embodiments, a structure used to fabricate a nanosheet semiconductor device includes a substrate, and two or more sets of silicon layers formed above the substrate. Each of the two or more sets of silicon layers is parallel to others of the two or more sets of silicon layers in a first direction and each of the two or more sets of silicon layers includes gaps between the silicon layers of the respective set of silicon layers. An inner spacer is in the gaps of the two or more sets of silicon layers at a first end and a second end along a second direction, which is perpendicular to the first direction.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-36 show the process flow of the fabrication of a FET with stacked nanosheets according to one or more embodiments, in which:

FIG. 1 shows a top view of the FET;

FIG. 2 shows a cross-sectional view of a nanosheet stack with a nitride hardmask;

FIG. 3 shows a different cross-sectional view of the intermediate structures shown in FIG. 2;

FIG. 4 shows the result of depositing an oxide and a lithographic mask on the structure shown in FIGS. 2 and 3;

FIG. 5 shows the etch at the ends of each nanosheet;

FIG. 6 shows a cross-sectional view of the structure resulting from performing an isotropic etch on the structure shown in FIGS. 4 and 5;

FIG. 7 indicates divots in the nanosheet stack that result from the isotropic etch;

FIG. 8 depicts a cross-sectional view following a nitride backfill;

FIG. 9 shows a different cross-sectional view of the same structure shown in FIG. 8 and shows the divots filled with the nitride;

FIG. 10 is a cross-sectional view showing a fin reveal of the nanosheet fins;

FIG. 11 is a different cross-sectional view of the structure shown in FIG. 10;

FIG. 12 is a cross-sectional view of an intermediate structure that results from release of silicon germanium from the nanosheet stack;

FIG. 13 is a cross-sectional view that indicates anchoring of the silicon layers of the nanosheet by the nitride fill;

FIG. 14 shows an intermediate structure that results from an oxide fill;

FIG. 15 shows a different cross-sectional view of the intermediate structure shown in FIG. 14;

FIG. 16 is a cross-sectional view showing a result of recessing the hardmask and oxide layers;

FIG. 17 is a different cross-sectional view of the intermediate structure shown in FIG. 16;

FIG. 18 shows the intermediate structure that results from removal of the hardmask;

FIG. 19 shows a cross-sectional view along a nanosheet of the same intermediate structure shown in FIG. 18;

FIG. 20 shows the result of an anisotropic etch on the structure shown in FIGS. 18 and 19;

FIG. 21 is a cross-sectional view along a nanosheet of the same intermediate structure shown in FIG. 20;

FIG. 22 is a cross-sectional view resulting from deposition of an extra gate oxide;

FIG. 23 is a different cross-sectional view of the same intermediate structure shown in FIG. 22;

FIG. 24 shows the result of removing the extra gate oxide and depositing oxide;

FIG. 25 is a cross-sectional view that shows the dummy gate stack formed above the nanosheet stack;

FIG. 26 shows an intermediate structure resulting from recessing the nanosheets and oxide except under the dummy gate stack;

FIG. 27 is a cross-sectional view of the same structure and shows the result of recessing the nanosheets to leave nanosheets only below the dummy gate stack;

FIG. 28 shows an intermediate structure that results from a repeated deposition and etch of an inner spacer between the nanosheets;

FIG. 29 is a different cross-sectional view of the structure shown in FIG. 28 and shows the inner spacer below the dummy gate stack;

FIG. 30 is a resulting structure based on deposition of silicon germanium;

FIG. 31 is a different cross-sectional view of the structure shown in FIG. 30 and indicates the silicon germanium fill in gaps surrounding the nanosheets;

FIG. 32 shows the result of a nitride liner encapsulation and oxide deposition;

FIG. 33 is a cross-sectional view of the same structure shown in FIG. 32 and indicates that the dummy gate stack is removed;

FIG. 34 is a cross-sectional view of an intermediate structure that results from removal of the extra gate oxide above the nanosheets;

FIG. 35 is a different cross-sectional view of the same structure shown in FIG. 34; and FIG. 36 is a cross-sectional view of a structure that results from formation of a replacement gate above the nanosheets.

DETAILED DESCRIPTION

As previously noted, nanosheets are increasingly used in semiconductor chips. Known nanosheet fabrication processes include epitaxially growing a stack of alternating Si and SiGe layers on a silicon substrate and removing the SiGe layers after forming spacers, forming the source and drain regions, and removing the dummy gate. However, etching the sacrificial SiGe in the stack can result in an etch of the SiGe source and drain in pFET devices. This undesired etch of SiGe in the source and drain regions leads to failure of the resulting transistors. Accordingly, a nanosheet fabrication process is needed that addresses the SiGe etch in the source and drain regions.

Turning now to an overview of the present invention, one or more embodiments provide fabrication methodologies and resulting structures for forming nanosheets. More specifically, one or more embodiments detailed herein include replacing the SiGe layers in the nanosheet stack with an oxide. The nanosheets are interlocked mechanically with a dielectric after the fin cut to anchor the nanosheets. After the first fin reveal, the nanosheets are released and suspended with an oxide matrix, thereby eliminating the need to remove SiGe during the remainder of the nanosheet fabrication. The oxide matrix is removed selective to the Si or SiGe channel, the source and drain, the dielectric spacer, and silicon boron carbon nitrogen (SiBCN) inner spacers prior to the replacement metal gate processing. The combination of the anchoring and oxide replacement of SiGe in the nanosheet stack avoids the issues presented by etching of SiGe layers in the formation of the nanosheets.

Figure 1:
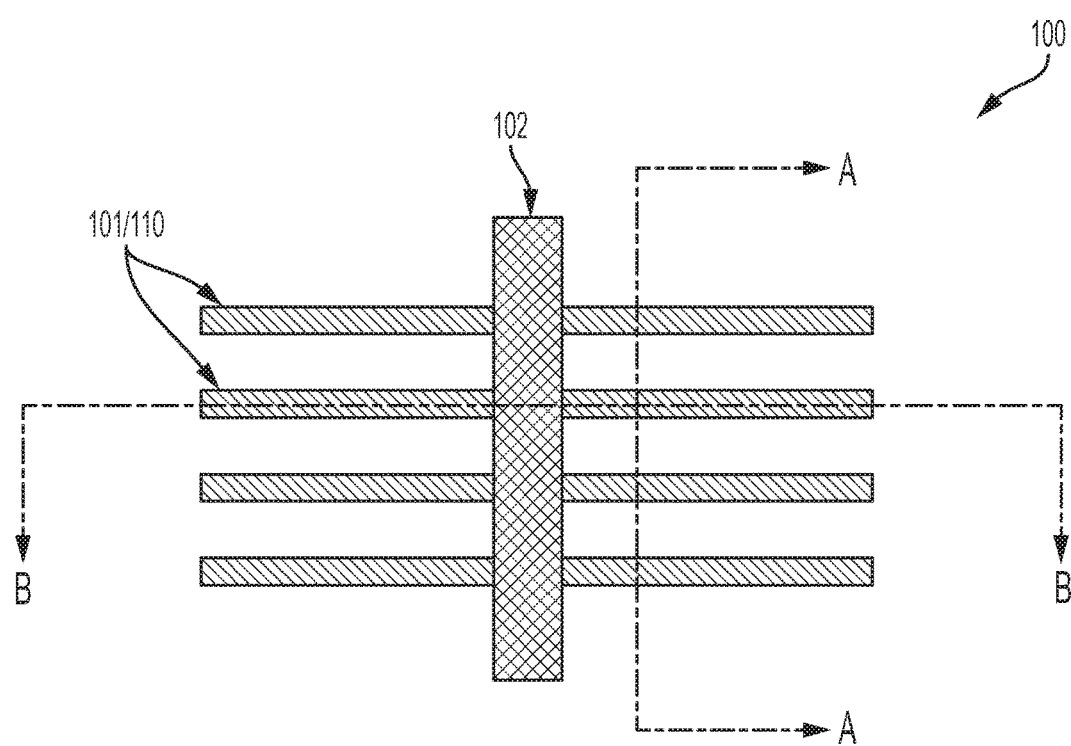
Figure 2:
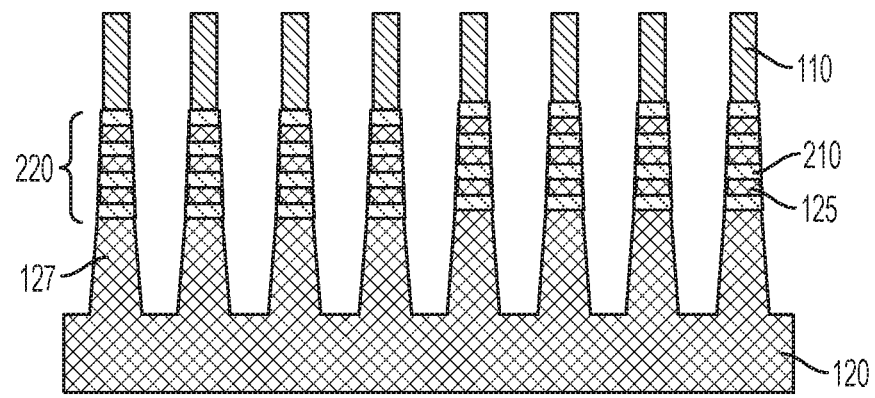
Figure 3:
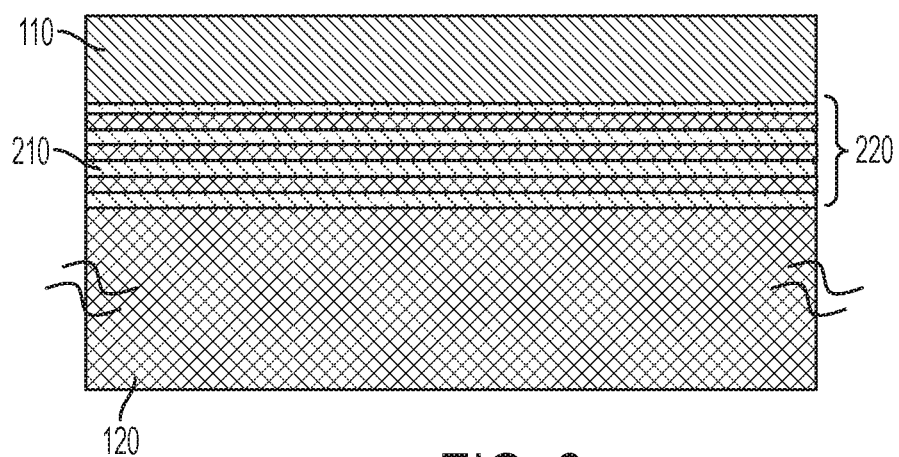

Turning now to a more detailed description of one or more embodiments, FIGS. 1-36 show the process flow for fabrication of a FET 100 with stacked nanosheets 101. A silicon nitride (SiN) 110 cap is shown on the nanosheets 101. A gate 102 is also shown with the channel region below obscured. Two cross-sections A-A, which is across the nanosheets 101, and B-B, which is along a nanosheet 101, are indicated. FIG. 2 shows a cross-sectional view along A-A of an intermediate structure used to fabricate the FET 100. FIG. 3 shows a cross-sectional view along B-B of the same intermediate structure shown in FIG. 2. A nanosheet stack 220 is formed on a Si base 127 formed on a Si substrate 120 as a fin and can be referred to as a nanosheet fin at this stage. The nanosheet stack 220 includes Si layers 125 that ultimately form the nanosheets 101. These Si layers 125 are formed with alternating SiGe layers 210. SiN 110 is formed above each nanosheet stack 220 as a hardmask for fin patterning of the nanosheet stack 220. The known processes that are used to fabricate the intermediate structure shown in FIGS. 2 and 3 are not detailed. These include alternating epitaxial growth of Si and SiGe and a reactive ion etch (ME) process to form the multiple nanosheet stacks 220 shown in FIG. 2 with trenches therebetween.

Figure 4:
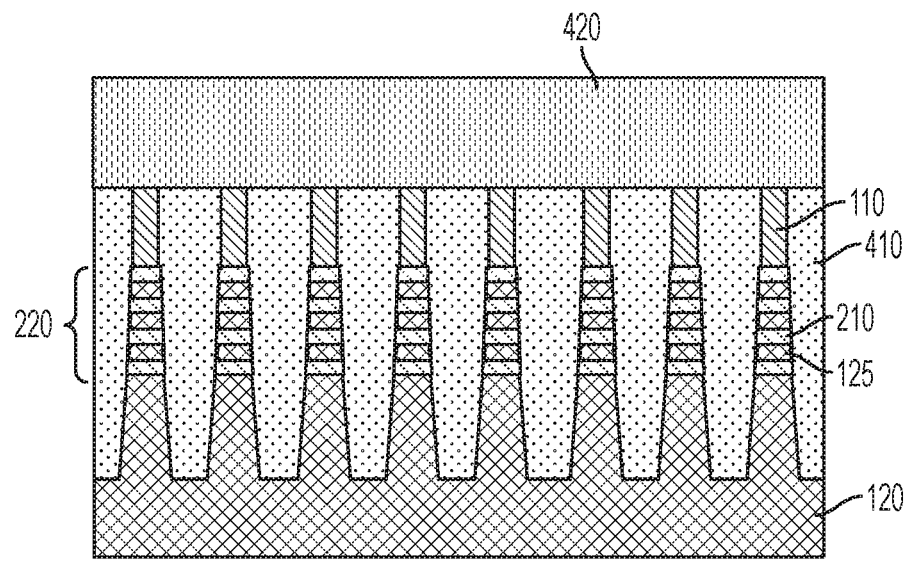
Figure 5:
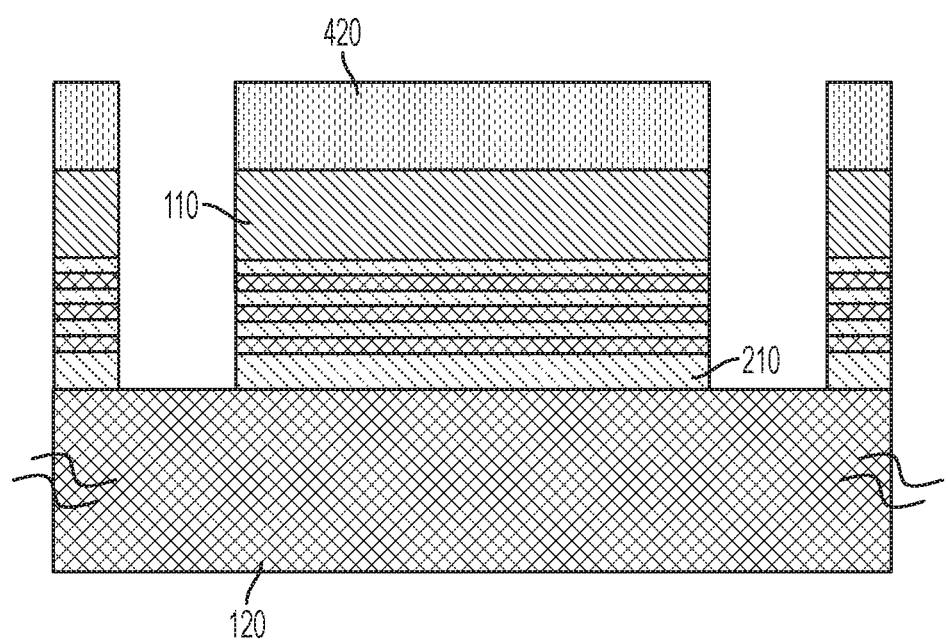

FIG. 4 shows a cross-sectional view along A-A, across the nanosheets 101, of an intermediate structure that results from performing a shallow trench isolation (STI) fill between the nanosheet stacks 220 and a process referred to below as a fin cut. An oxide 410 is used to fill the trenches between the nanosheet fins, and a chemical mechanical planarization (CMP) process is used to remove the excess oxide 410. The oxide 410 is silicon dioxide ($SiO_2$), for example. A lithographic mask 420, which can include an organic planarizing layer, an anti-reflective coating (ARC) film, and photo resist, is deposited on the oxide 410. The lithographic mask 420 can be applied in different layout configurations according to alternate embodiments and can be applied in conjunction with an ME process as needed in order to define the number of fins of the nanosheet stacks 220 and to define the length of the nanosheet fins. This process is referred to as a fin cut. The number and configuration of nanosheet fins in a device is defined by placing the lithographic mask 420 atop the nanosheet fins to be retained. For example, FIG. 4 shows that all nanosheet fins are to remain because all the nanosheet fins have the lithographic mask 420 above. FIG. 5 shows a cross-sectional view along B-B, along a nanosheet 101, of the intermediate structure shown in FIG. 4. As FIG. 5 indicates, the edges of the nanosheet stack 220 are etched to define the length of the nanosheet fin. The etching is performed though a RIE process, for example.

Figure 6:
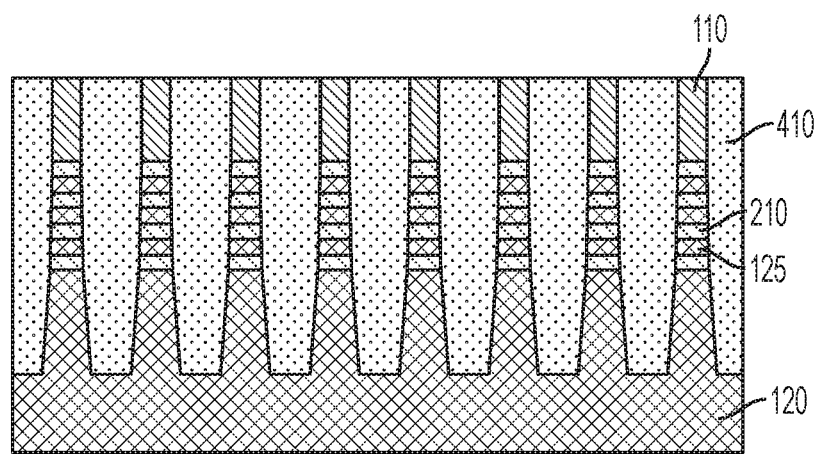
Figure 7:
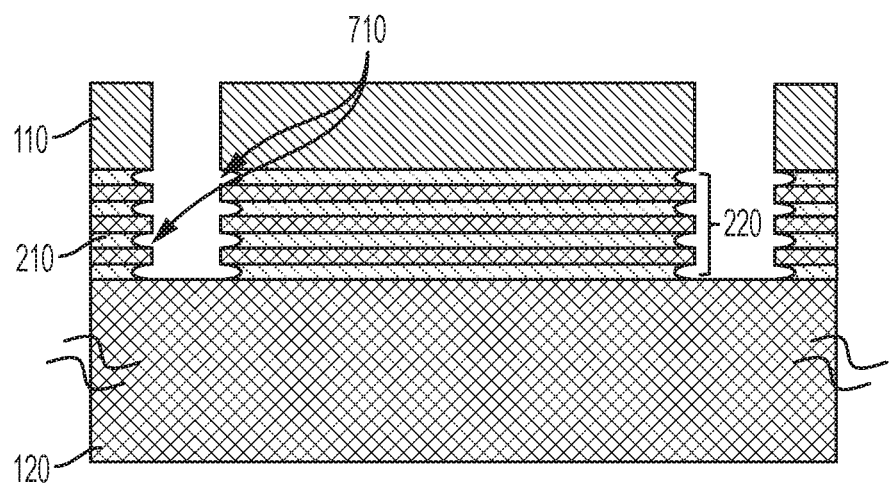

FIG. 6 shows a cross-sectional view along A-A of an intermediate structure that results from an isotropic etch of the structure shown in FIGS. 4 and 5. The only discernable difference in the structure, according to the cross-sectional view across the nanosheets 101 shown in FIG. 6, is removal of the lithographic mask 420. FIG. 7 shows the cross-sectional view along a nanosheet 101 (along B-B) of the same intermediate structure shown in FIG. 6. The isotropic etch results in undercutting of the SiGe layer 210 in the nanosheet stack 220. The undercutting results in the divots 710 shown in FIG. 7.

Figure 8:
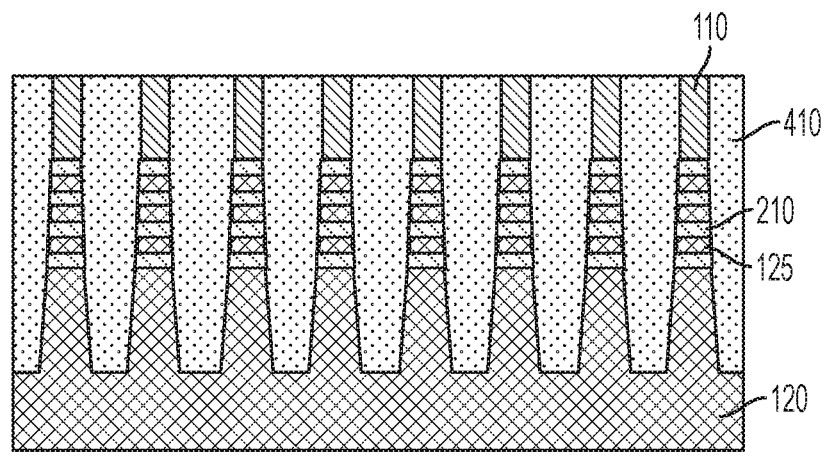
Figure 9:
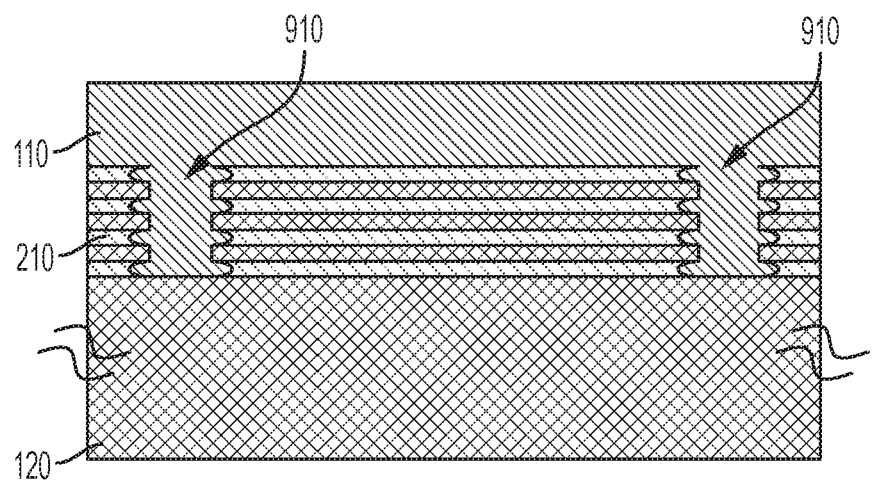

FIG. 8 shows a cross-sectional view along A-A. A SiN 110 backfill is performed on the structure shown in FIGS. 6 and 7. The SiN 110 backfills any cavity formed during the fin cut process, including cavities formed in the direction perpendicular to the nanosheet fins, in which are not visible in FIG. 8. FIG. 9 shows the cross-sectional view along a nanosheet 101 of the same structure shown in FIG. 8. The SiN 110 fill is in the regions 910 and the divots 710 shown in FIG. 7. The SiN 110 fill is followed by a CMP process.

Figure 10:
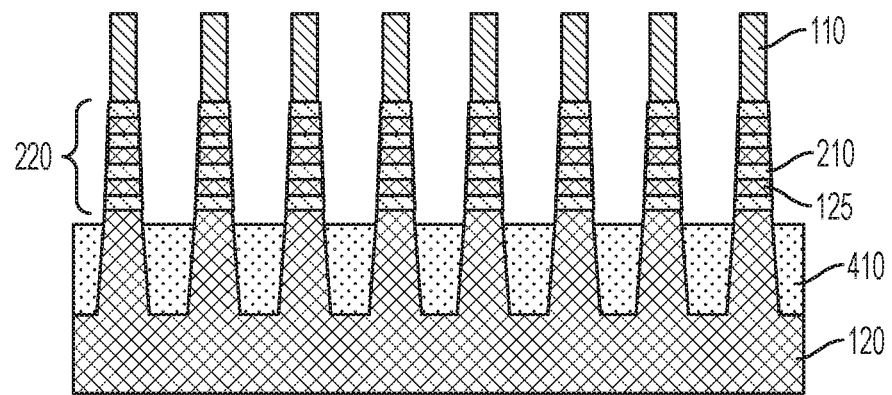
Figure 11:
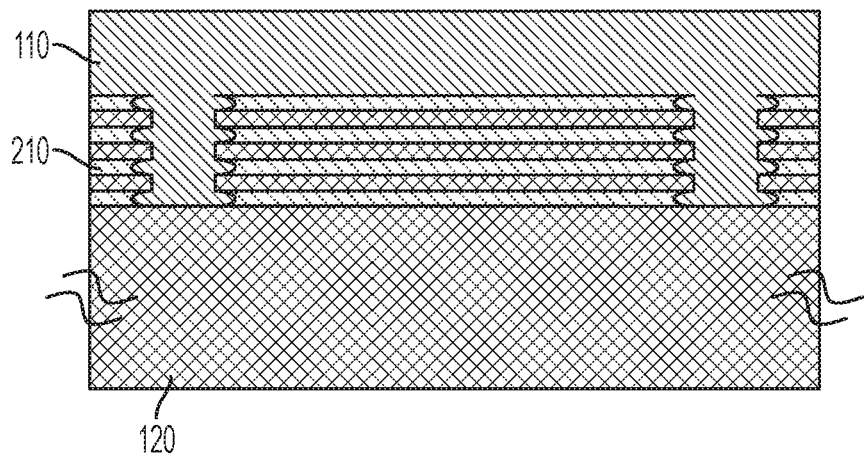

FIG. 10 is a cross-sectional view along A-A (across the nanosheets 101) and shows the result of revealing the nanosheet stack 220 fins. The oxide 410 is recessed to expose the fin nanosheets formed from the nanosheet stack 220 and the SiN 110 hardmask. FIG. 11 is a cross-sectional view along B-B of the same structure shown in FIG. 10 and shows that the oxide 410 recess is selective to SiN 110. As a comparison of FIG. 11 with FIG. 9 indicates, the fin reveal does not result in a discernable difference in the view along a nanosheet 101 (i.e., along B-B).

Figure 12:
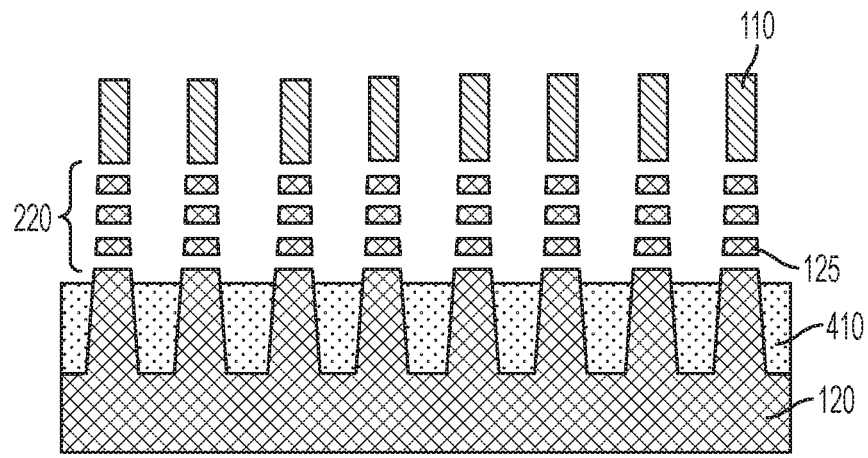
Figure 13:
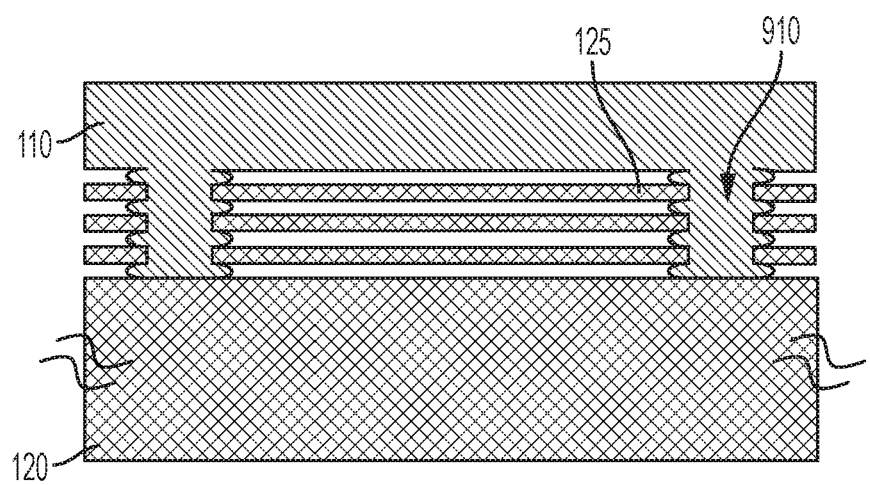

FIG. 12 is a cross-sectional view across the nanosheets 101 (along A-A) that shows the release of SiGe layers 210 from the nanosheet stack 220 using an isotropic dry or wet SiGe etch process that is selective to Si. FIG. 13 is a cross-sectional view along B-B of the same intermediate structure as the one shown in FIG. 12. Based on the release of the SiGe layers 210, the alternating Si layers 125 in the nanosheet stack 220 appear to be floating in FIG. 12. However, the view in FIG. 13 clarifies that the SiN 110 fill in the regions 910 and in the divots 710 acts as an anchor for the Si layers 125. This anchoring is a key part of the process flow that differentiates the one or more embodiments detailed herein with known nanosheet formation. The anchoring facilitates replacement of the SiGe layers 210 with an oxide matrix.

Figure 14:
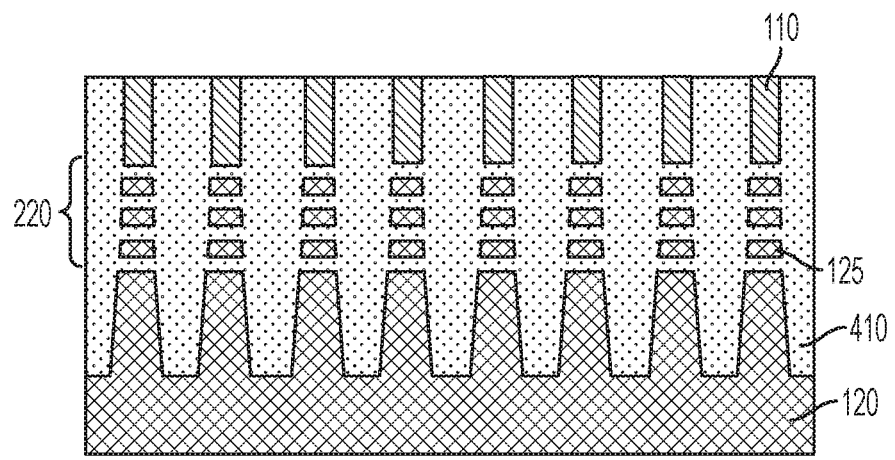
Figure 15:
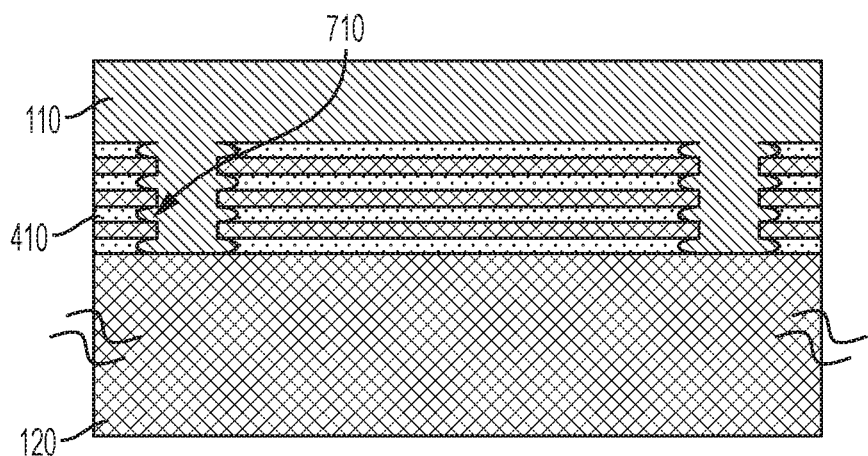

FIG. 14 is a cross-sectional view along A-A of an intermediate structure that results from filling back the gaps between the nanosheet stacks 220 with the oxide 410, as indicated by FIG. 12. FIG. 15 is a cross-sectional view along B-B of the same intermediate structure that is shown in FIG. 14. As FIG. 15 indicates, the SiN 110 still fills the divots 710 within the nanosheet stack 220 but the oxide 410 fills the gaps between Si layers 125. The oxide 410 deposition is followed by a CMP process. At this stage in the processing, the SiGe layers 210 in the nanosheet stack 220 (see e.g., FIG. 11) have been replaced by oxide 410 and the source and drain regions are not yet formed. As a result, subsequent processing of the nanosheets 101 does not involve etching of the SiGe layers 210 and avoids the issue of SiGe being etched in the source and drain regions as well as between the nanosheets.

Figure 16:
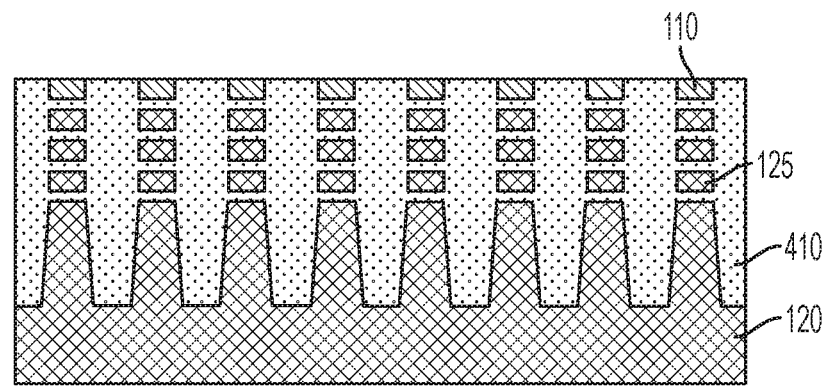
Figure 17:
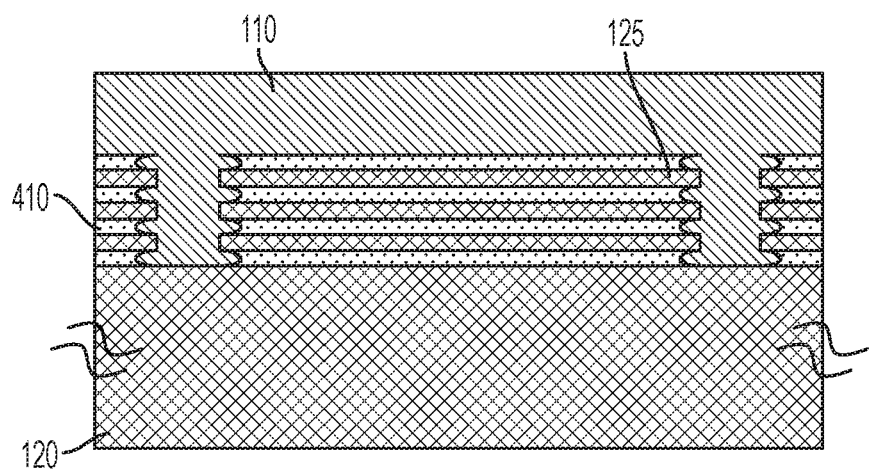

FIG. 16 is a cross-sectional view along A-A of an intermediate structure that results from a non-selective recess of the SiN 110 and oxide 410 approaching the fin top. FIG. 17 is a cross-sectional view along B-B of the same intermediate structure that is shown in FIG. 16. The removal of the SiN 110 is indicated in FIG. 17, as well.

Figure 18:
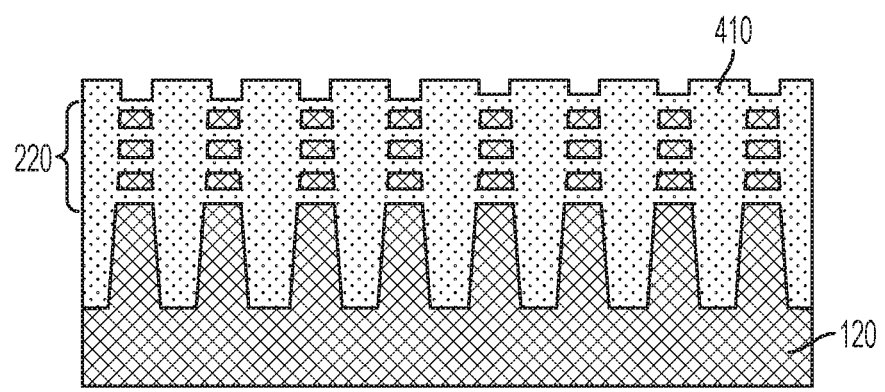
Figure 19:
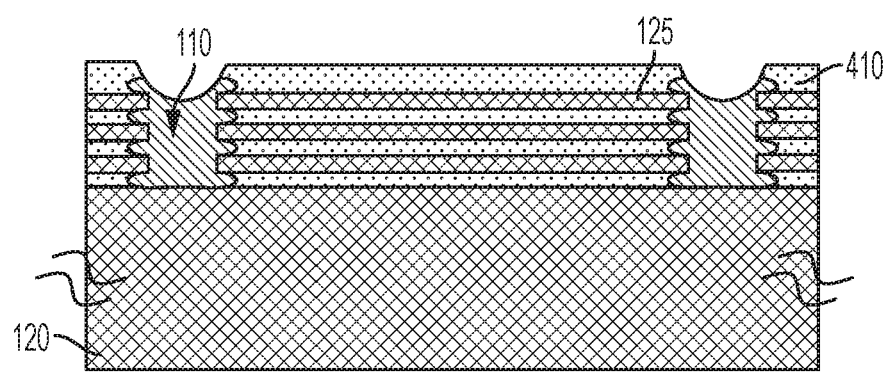

FIG. 18 is a cross-sectional view along A-A, across the nanosheets 101. FIG. 18 indicates the result of removing the SiN 110 hardmask above the nanosheet stack 220. The SiN 110 removal is selective and does not affect the oxide 410. FIG. 19 shows a cross-sectional view along B-B and indicates the selective removal of SiN 110 on the ends of each nanosheet stack 220.

Figure 20:
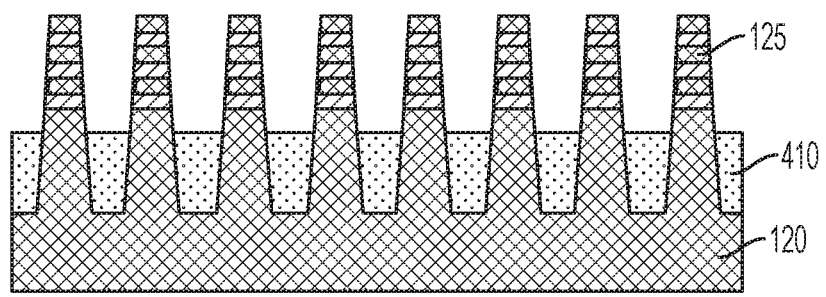
Figure 21:
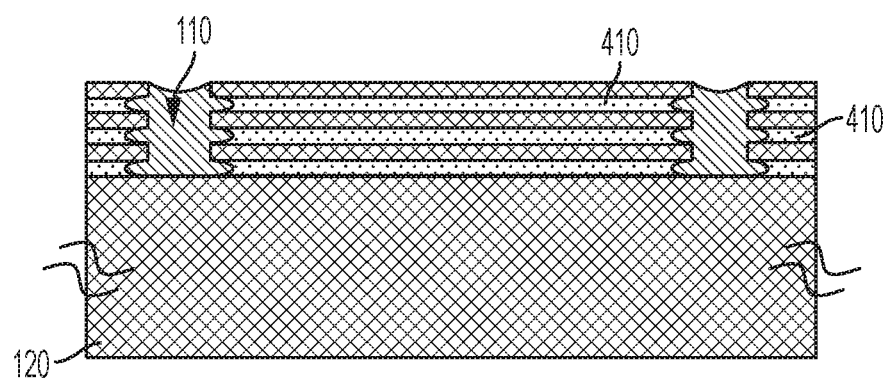

FIG. 20 shows a nanosheet reveal in a cross-sectional view along A-A. An anisotropic etch such as an RIE process is used to etch the oxide 410 between fins. This etch is not discernible in FIG. 21, which shows a cross-sectional view along B-B for the same intermediate structure that is shown in FIG. 20.

Figure 22:
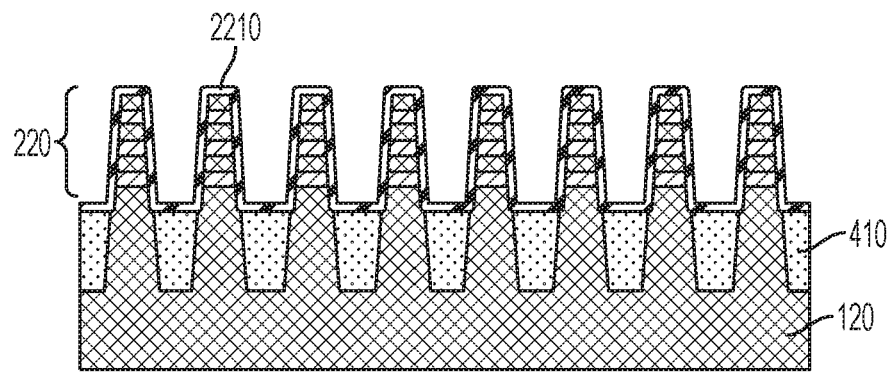
Figure 23:
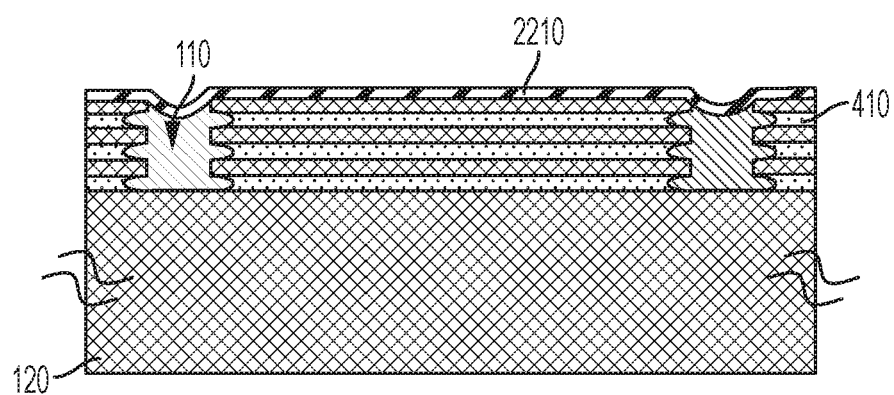

FIG. 22 is a cross-sectional view along A-A of the intermediate structure that results from depositing an extra gate (EG) oxide 2210 conformally on the nanosheet stack 220 and the oxide 410 between fins. FIG. 23 is a cross-sectional view along B-B and indicates that the EG oxide 2210 is conformally deposited along the length of each nanosheet stack 220. At this stage, gate patterning is performed.

Figure 24:
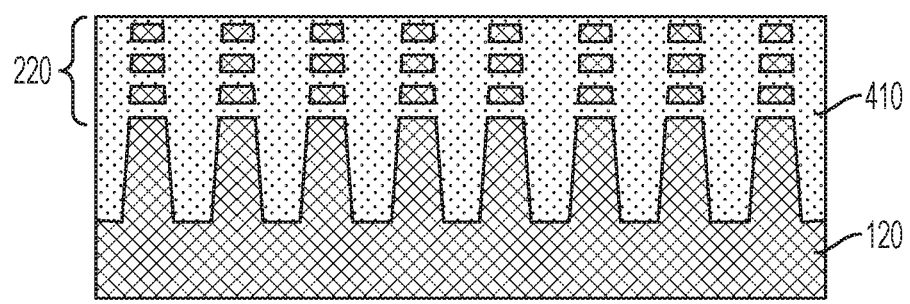
Figure 25:
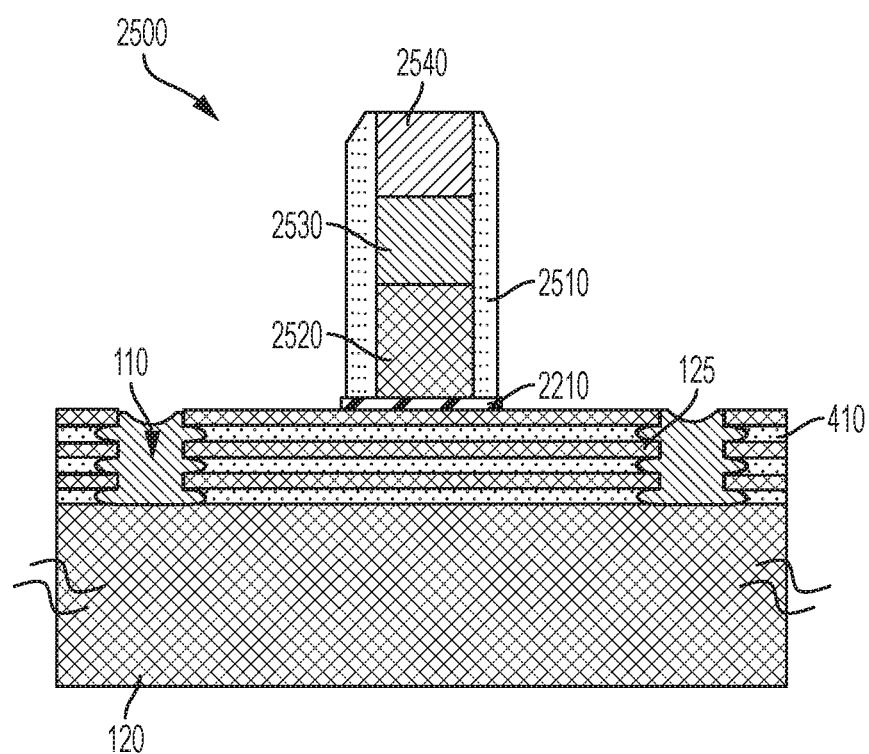

FIG. 24 shows the result of removing the EG oxide 2210 and depositing oxide 410 in a cross-sectional view along A-A. A CMP process is performed to remove excess oxide 410. FIG. 25 shows the intermediate structure shown in FIG. 24 but along B-B. FIG. 25 shows the formation of a dummy gate stack 2500 above a nanosheet stack 220. The EG oxide 2210 is retained at the interface between the dummy gate stack 2500 and nanosheet stack 220 underneath. The dummy gate stack 2500 includes the dummy gate 2520, which is formed from Si, the gate hardmask 2530 and gate oxide hardmask 2540, which can be a single layer or dual layer dielectric that can include SiN and Si oxide according to an exemplary embodiment. Spacers 2510 comprised of a low-k dielectric are formed according to known processes. The low-k spacers 2510 can include silicon boron carbon nitride (SiBCN), silicon oxycarbonitride (SiOCN), or silicon oxynitride (SiON), for example.

Figure 26:
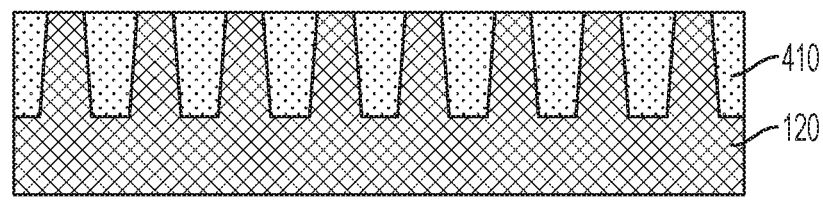
Figure 27:
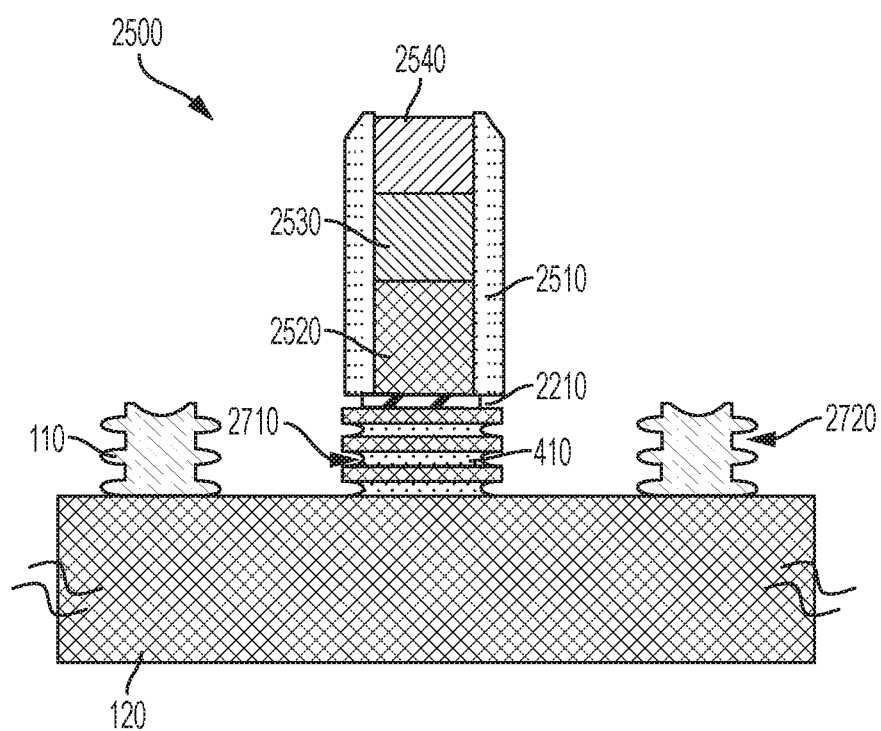

FIG. 26 is a cross-sectional view along A-A, which shows the result of recessing the nanosheet stacks 220. The recessing is achieved by an RIE process, and both the oxide 410 and portions of the Si layers 125 are removed. FIG. 27 shows a cross-sectional view along B-B for the same intermediate structure shown in FIG. 26. The view shown in FIG. 27 indicates that the nanosheet stack 220 is retained only below the dummy gate stack 2500. The SiN 110 that acted as an anchor (FIG. 13) for the alternating Si layers 125 of the nanosheet stack 220 is retained. The divots 2710 under the spacers 2510 and spaces 2720 in the SiN 110 are formed by an isotropic etch.

Figure 28:
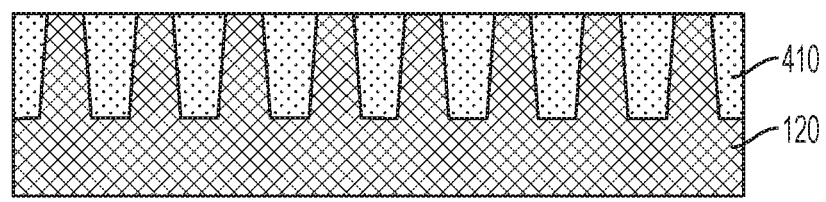
Figure 29:
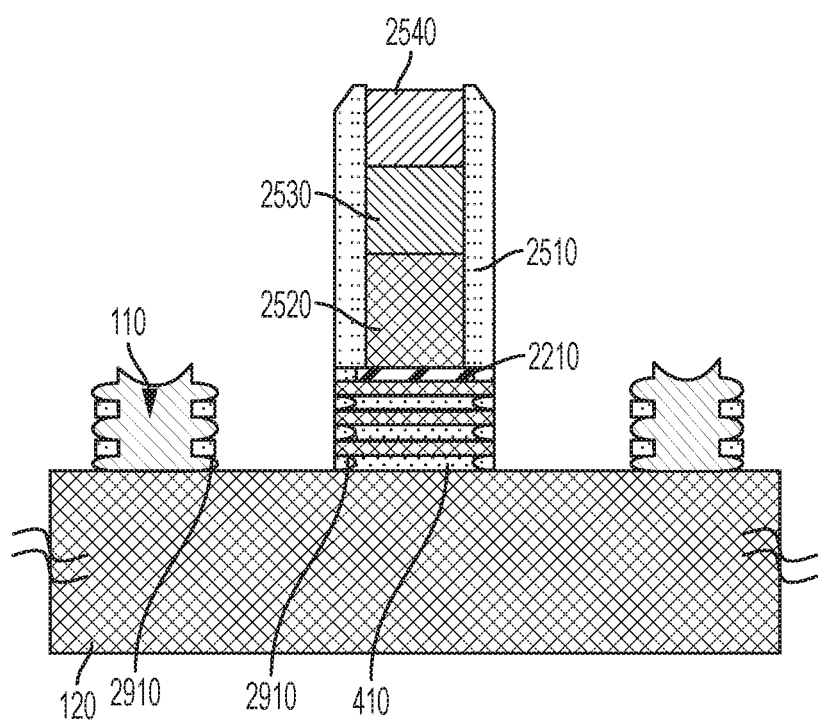

FIG. 28 is a cross-sectional view along A-A of an intermediate structure that results from a repeated deposition and etch of an inner spacer 2910. As a comparison of FIGS. 26 and 28 indicates, no difference is discernible in the cross-sectional view across nanosheets 101. FIG. 29 is a cross-sectional view along B-B. As FIG. 29 indicates, the deposition and etch of the inner spacer 2910 results in the inner spacer 2910 filling the divots 2710 and spaces 2720 shown in FIG. 27. The inner spacer 2910 can be SiN or a low-k spacer such as SiBCN, SiOCN, or SiON according to exemplary embodiments.

Figure 30:
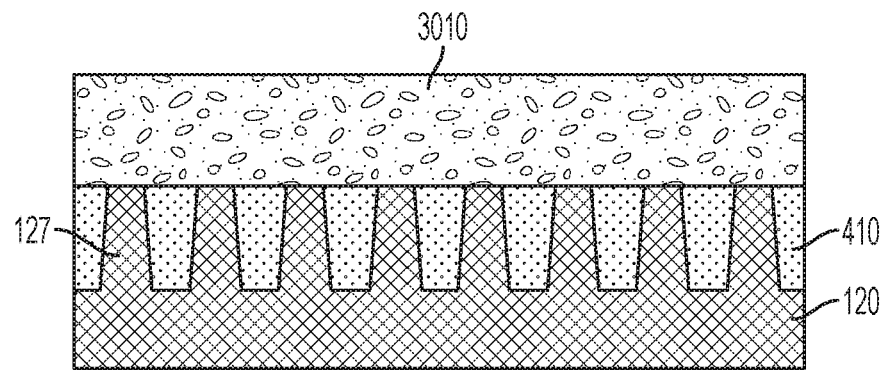
Figure 31:
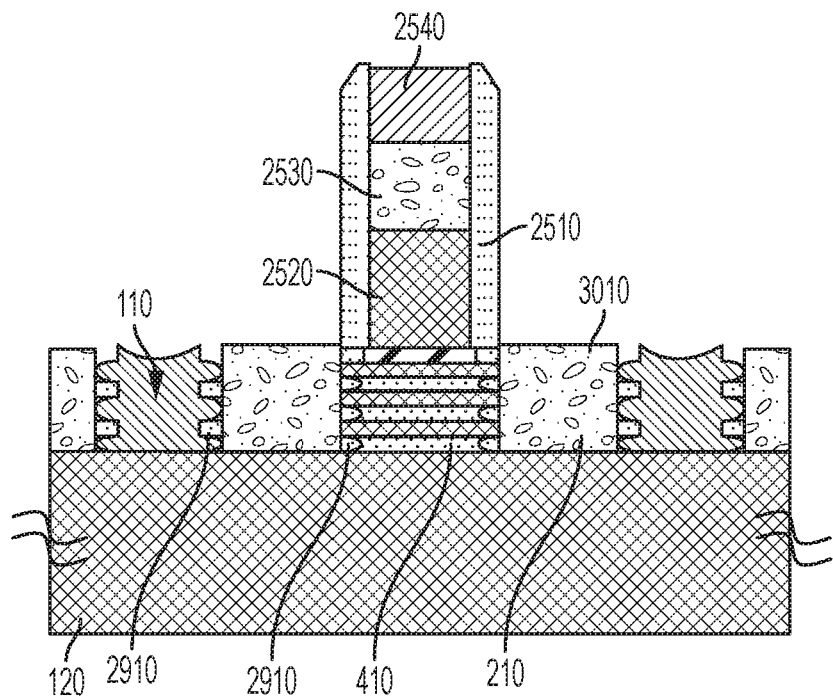

FIG. 30 is a cross-sectional view along A-A, which shows SiGe 3010 epitaxially grown on the Si base 127 and over the oxide 410 of the intermediate structure shown in FIG. 28. This SiGe 3010 forms the source and drain regions. FIG. 31 shows a cross-sectional view along B-B for the same intermediate structure shown in FIG. 30. As FIG. 31 indicates, the SiGe 3010 growth fills the gaps, shown in FIG. 29, that are left by the removal of the nanosheet stack 220 everywhere except under the dummy gate stack 2500. The formation of the source and drain regions after removal of the SiGe layers 210 from between the nanosheet stacks 220 (as discussed with reference to FIGS. 12 and 13) avoids the previously discussed issues of undesired etch of SiGe 3010 during removal of sacrificial SiGe layers 210.

Figure 32:
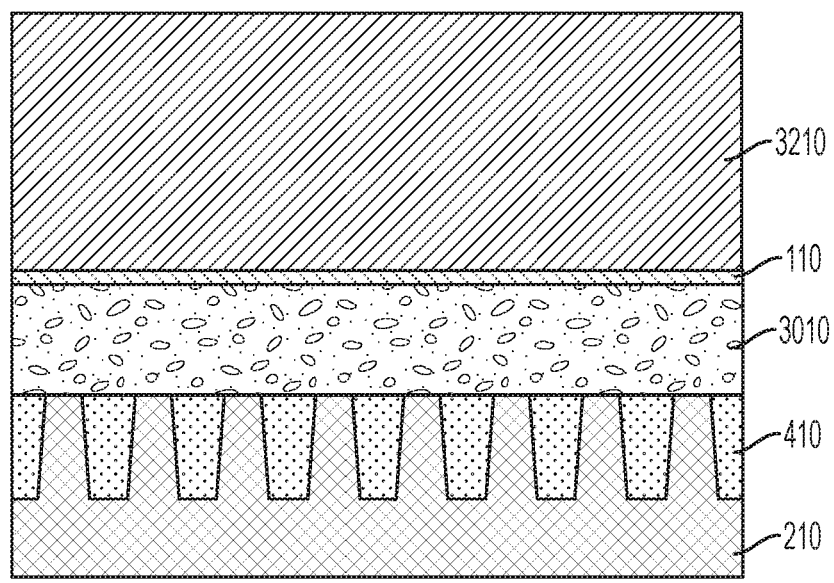
Figure 33:
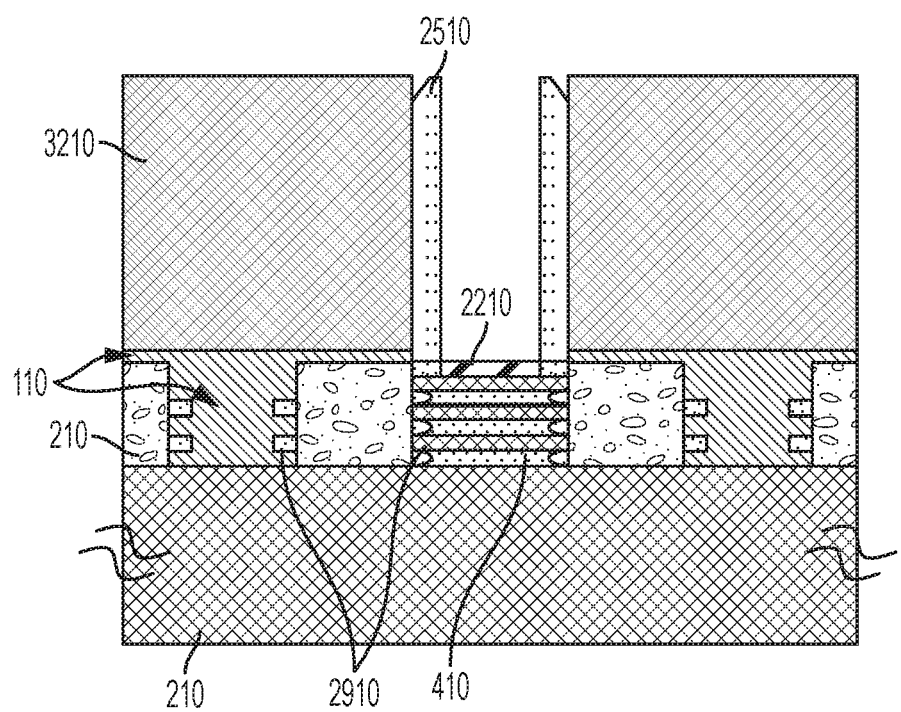

FIG. 32 is a cross-sectional view of an intermediate structure along A-A. The intermediate structure shown in FIG. 32 results from several known processes involved in the removal of the dummy gate stack 2500. SiN 110 is deposited over the SiGe 3010 layer in a process referred to as a nitride liner encapsulation. An oxide 3210 is deposited as an inter-layer dielectric (ILD) over the SiN 110. This ILD oxide 3210 can be the same material as the oxide 410 according to exemplary embodiments. FIG. 33 is a cross-sectional view along B-B of the same structure shown in FIG. 32. The SiN 110 nitride liner encapsulation is shown, as well as the deposition of the ILD (SiN 110) followed by a CMP process. In alternate embodiments, the nitride liner encapsulation can be achieved by a different nitride that acts as an oxidation barrier. The dummy gate stack 2500 is removed, revealing the EG oxide 2210 at the base of the dummy gate stack 2500, between the spacers 2510.

Figure 34:
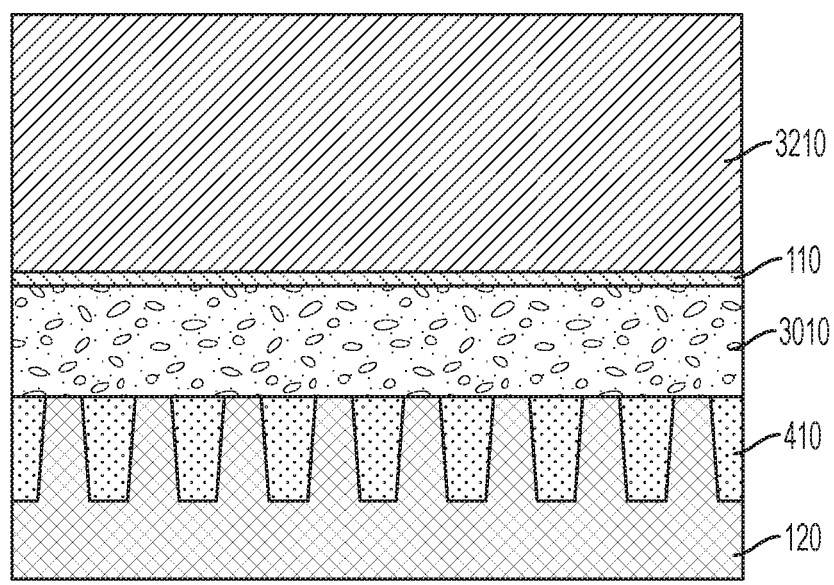
Figure 35:
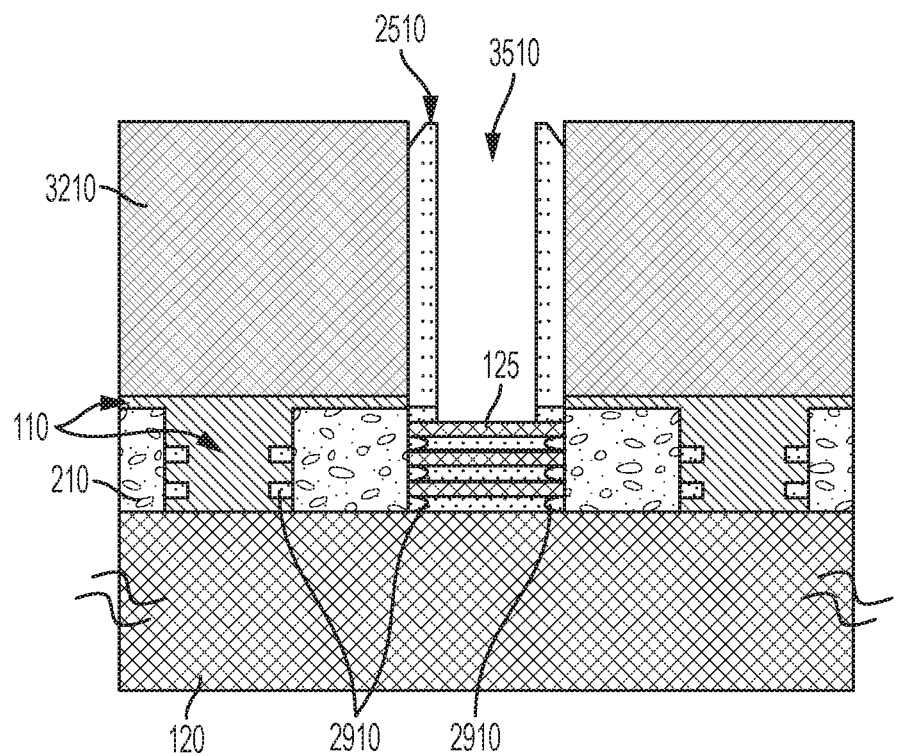

FIG. 34 is a cross-sectional view along A-A of an intermediate structure that results from processing of the structure shown in FIGS. 32 and 33. The results of the processing are not discernible in the view shown across nanosheets 101 in FIG. 34. FIG. 35 shows a cross-sectional view of the same intermediate structure as the one shown in FIG. 34. As FIG. 35 indicates, the EG oxide 2210 between the spacers 2510 is removed and the oxide 410 between the Si layers 125 of the nanosheet stack 220 are also removed. This leaves an opening 3510 above the Si layers 125. As FIG. 33 indicates, oxide 410, rather than the SiGe layers 210, separates the Si layers 125 that make up the nanosheets 101. As previously discussed, the issue of etching the SiGe layers 210 from between the nanosheet stack 220, without affecting SiGe 3010 in the source and drain regions, is avoided entirely according to the one or more embodiments. Removing the oxide 410, via an isotropic etch, is more selective than removing SiGe.

Figure 36:
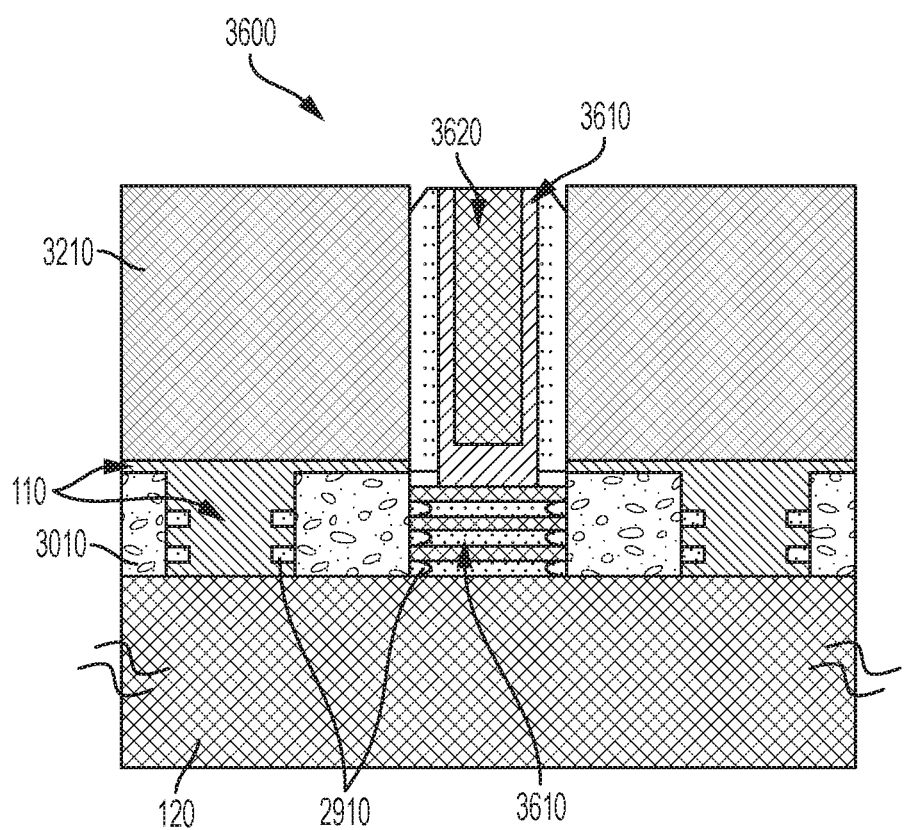

FIG. 36 shows the structure that results from formation of the gate 3600. A high-k dielectric and work function metal 3610 are used to conformally line the opening 3510 and to fill the gaps between Si layers 125 below the gate 3600. A gate metal 3620 is deposited to fill the opening 3510 followed by a CMP process to remove excess gate metal 3620. The FET 100 that results from the processes shown in FIGS. 1-36 and additional known processes differs from a nanosheet device that is fabricated according to known processes, because the source and drain regions are not compromised due to removal of the SiGe layers 210 between the nanosheets after the formation of the source and drain regions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A structure used to fabricate a nanosheet semiconductor device, the structure comprising:
   a substrate;
   two or more sets of silicon layers formed above the substrate, wherein each of the two or more sets of silicon layers is parallel to others of the two or more sets of silicon layers in a first direction and each of the two or more sets of silicon layers includes gaps between adjacent ones of the silicon layers of each respective set of silicon layers; and
   a dielectric material configured to anchor each of the two or more sets of silicon layers at a first end and a second end of each of the two or more sets of silicon layer along a second direction, which is perpendicular to the first direction, wherein the dielectric material partially fills the gaps between the adjacent ones of the silicon layers of each respective set of silicon layers of the two or more sets of silicon layers and is between adjacent ones of the two or more sets of silicon layers.

2. The structure according to claim 1, wherein the dielectric material is silicon nitride.

3. The structure according to claim 1, further comprising an oxide filling the gaps between the adjacent ones of the silicon layers of each respective set of silicon layers of the two or more sets of silicon layers that are unfilled by the dielectric material.

4. The structure according to claim 1, further comprising a dummy gate stack formed above one of the two or more sets of silicon layers.

5. The structure according to claim 4, further comprising a gate oxide between the one of the two or more sets of silicon layers and the dummy gate stack.

6. The structure according to claim 4, wherein the dummy gate stack includes a dummy gate.

7. The structure according to claim 4, wherein the dummy gate stack includes a gate hardmask.

8. The structure according to claim 4, wherein the dummy gate stack includes a gate oxide hardmask.

9. The structure according to claim 4, further comprising low-k dielectric spacers on each side of the dummy gate stack.

* * * * *